United States Patent
Samudra et al.

(10) Patent No.: US 6,284,606 B1
(45) Date of Patent: Sep. 4, 2001

(54) PROCESS TO ACHIEVE UNIFORM GROOVE DEPTH IN A SILICON SUBSTRATE

(75) Inventors: Ganesh S. Samudra, Singapore (SG); Krishnasamy Rajendran, Heverlee (BE); Chi Kwan Lau; Mei Sheng Zhou, both of Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 09/483,038

(22) Filed: Jan. 18, 2000

(51) Int. Cl.[7] .................................................. H01L 21/336
(52) U.S. Cl. .......................... 438/270; 438/138; 438/197; 438/268; 438/289; 438/303; 438/442; 438/589; 438/700
(58) Field of Search ..................................... 438/270, 138, 438/197, 268, 289, 303, 442, 589, 700

(56) References Cited

U.S. PATENT DOCUMENTS

| | | | |
|---|---|---|---|
| 4,331,708 | * 5/1982 | Hunter | 427/93 |
| 4,729,815 | 3/1988 | Leung | 156/643 |
| 4,980,314 | 12/1990 | Strege | 437/129 |
| 5,525,552 | * 6/1996 | Huang | 437/41 |
| 5,654,238 | 8/1997 | Cronin et al. | 438/700 |
| 5,821,169 | 10/1998 | Nguyen et al. | 438/736 |
| 5,869,395 | 2/1999 | Yim | 438/637 |
| 5,972,754 | * 10/1999 | Ni et al. | 438/270 |
| 6,043,125 | * 3/2000 | Williams et al. | 438/270 |
| 6,060,362 | * 5/2000 | Rhee | 438/301 |

OTHER PUBLICATIONS

Chung–Kyu Yeon et al., "Deep–submicron trench profile control using a magnetron enhanced reactive ion etching system for shallow trench isolation", J. Vac. Sci. Technol. A 16(3), May/Jun. '98, pp. 1502–1508.

Tsengyou Syau et al., "Reactive Ion Etching of Silicon Trenches Using $SF_6/O_2$ Gas Mixtures", J. Electrochem. Soc., vol. 138, No. 10, Oct. 1991, pp. 3076–3081.

A. Burtsev et al., "An anisotropic U–shaped SF6–based plasma silicon trench etching investigation", Microelectronic Engineering 40, 1998, Elsevier Science B.V., pp. 85–97.

V.A. Yunkin et al., "Experimental study and computer simulation of aspect ratio dependent effects observed in silicon reactive ion etching", Microelec. Eng. 30, (1996) pp. 345–348.

* cited by examiner

*Primary Examiner*—Richard Elms
*Assistant Examiner*—Pho Luu
(74) *Attorney, Agent, or Firm*—George O. Saile; Rosemary L. S. Pike

(57) ABSTRACT

A process for forming a groove in a semiconductor substrate, to be used to fabricate grooved gate, MOSFET devices, has been developed. The process features the use of an insulator mask, used as an etch mask for definition of the groove feature in the semiconductor substrate. A selective, anisotropic RIE procedure, using an etchant with a specific etch rate ratio of silicon, (semiconductor substrate), to silicon oxide, (insulator mask), is used to establish the desired groove depth, in the semiconductor substrate. The combination of a specific thickness of insulator shape, and a specific etch rate ratio for the selective, anisotropic RIE procedure, allows the desired depth of the groove to be established when the insulator shape is completely removed from the top surface of the semiconductor substrate. The groove depth established at this point of the RIE procedure, will not change during an overetch cycle, as a result of etching the now exposed, top surface of the semiconductor surface, at the same rate as exposed semiconductor, located at the bottom of the groove.

13 Claims, 3 Drawing Sheets

PROCESS TO ACHIEVE UNIFORM GROOVE DEPTH IN A SILICON SUBSTRATE

BACKGROUND OF THE INVENTION (1) Field of the Invention

The present invention relates to methods used to fabricate semiconductor devices, and more specifically to a method used to fabricate a grooved gate, metal oxide semiconductor field effect transistor, (MOSFET), device.

(2) Description of Prior Art

Grooved gate MOSFET devices have allowed the semiconductor industry to achieve the objectives of increased device density, and device performance. The ability to form a polysilicon, grooved gate structure, featuring deep sub-micron dimensions, obtained using the dimensions of the groove formed in the semiconductor substrate, in place of conventional polysilicon gate structures, defined via photolithographic and dry etching procedures, have allowed reductions in MOSFET area to be realized, thus resulting in increased device density. In addition the use of grooved gate technology has resulted in the suppression of short channel effects, encountered with conventional deep sub-micron, polysilicon gate, MOSFET devices. However the ability to form grooves with consistent depths, in all regions of the semiconductor substrate, has limited the use of grooved gate MOSFET devices.

This invention will teach a procedure in which the depth of the groove in the semiconductor substrate, is accurately controlled using a groove pattern, formed in an insulator layer, then using a reactive ion etching, (RIE), procedure, to form the grooves in the semiconductor substrate, with the RE procedure featuring a specific etch rate ratio between the insulator layer, and the silicon of the semiconductor substrate. The thickness of the masking insulator layer, and the RIE etching ambient, with a specific etch rate ratio, are chosen to result in complete removal of this masking insulator layer, at a point in which the desired depth of the groove in silicon is achieved. Additional etching, after removal of the masking insulator layer, will remove all exposed silicon at the same rate thus maintaining the desired groove depth, achieved at the point of consumption of the masking insulator layer. Prior art, such as Leung, in U.S. Pat. No. 4,729,815, as well as Nguyen et al, in U.S. Pat. No. 5,821,169, describe methods of forming patterns in silicon using RIE procedures, but these prior arts do not show the novelty of this invention using a masking insulator pattern, with a specific thickness designed to allow a desired depth for grooves in silicon, to be achieved, when using a RIE procedure, with a specific etch rate ratio, or etch selectivity, between the masking insulator layer, and the silicon semiconductor substrate.

SUMMARY OF THE INVENTION

It is an object of this invention to fabricate MOSFET devices, using groove gate structures.

It is another object of this invention to form the grooves in the semiconductor substrate, via a selective RIE procedure, using an insulator pattern, as a mask.

It is still another object of this invention to use a specific thickness of insulator mask, and to choose an etching ambient, designed with a specific etch rate selectivity between the insulator mask and the semiconductor substrate, to allow the desired depth of the groove in silicon to be achieved at the completion of, or with an additional overetch of, the masking insulator mask.

In accordance with the present invention a method of forming grooved gate MOSFET devices in a semiconductor substrate, featuring a combination of a specific thickness of an insulator mask, and a dry etching procedure with a specific etch rate selectivity between the insulator mask, and the semiconductor, resulting in the desired groove depth, as well as uniform groove depths, in all regions of the semiconductor substrate, is described. The desired, deep sub-micron, groove pattern is formed in an insulator layer, using conventional patterning procedures. The insulator mask, at a specific thickness, is then used as an etch mask, allowing exposed regions of the semiconductor substrate to be removed via a RIE procedure, featuring an etch selectivity that results in the desired depth of the deep sub-micron groove to be achieved when the insulator mask is consumed. The consumption of the insulator mask insures no change in the depth of the grooves during an additional, overetch cycle. A gate insulator is thermally grown, followed by the formation of gate structures, located in the grooves. Formation of source/drain regions, in an area of the semiconductor substrate, not occupied by the grooves, or covered by the gate structures, and formation of insulator spacers on the sides of the gate structure located above the grooves, complete the process used to create deep sub-micron, grooved gate MOSFET devices.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
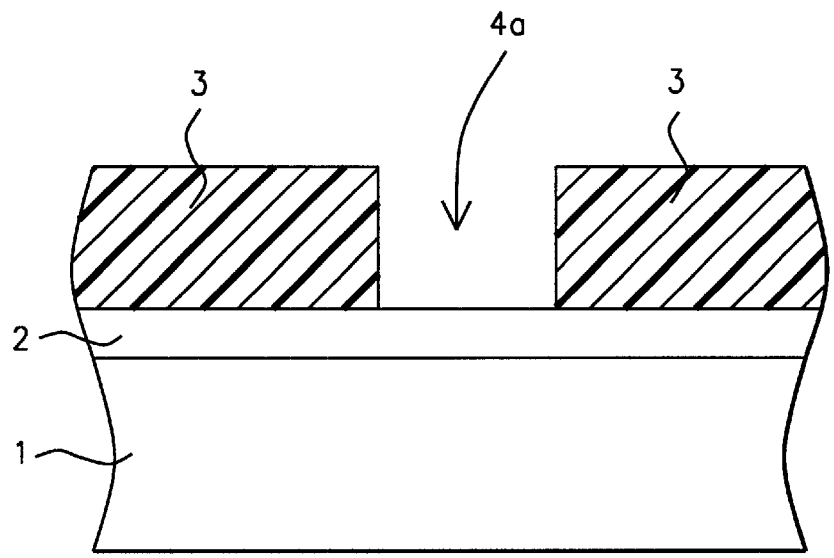
FIGS. 1–6, and 7B, which schematically, in cross-sectional style, show key stages of fabrication, used to create a grooved gate, MOSFET device.

The method of fabricating a grooved gate MOSFET device, featuring the combination of an insulator shape, chosen with a specific thickness, to be used as an etch mask, and a RIE ambient exhibiting a specific etch selectivity between the groove defining, insulator mask, and the semiconductor substrate, with the combination resulting in the desired depth of, and the desired uniformity of, the grooves, will now be described in detail. A semiconductor substrate 1, comprised of P type, single crystalline silicon, with a <100> crystallographic orientation, is used and schematically shown in FIG. 1. An insulator layer 2, comprised of silicon oxide, is next formed on semiconductor substrate 1, via thermal oxidation procedures, or via low pressure chemical vapor deposition, (LPCVD), or plasma enhanced chemical vapor deposition, (PECVD), procedures, at a thickness between about 20 to 1500 Angstroms. The thickness of insulator layer 2, is critical, when used as an etch mask during a subsequent reactive ion etching, (RIE), formation of grooves in semiconductor substrate 1. If desired insulator layer 2, can be comprised of silicon nitride, or of silicon oxynitride. A photoresist shape 3, with opening 4a, is then formed on insulator layer 2. The width of opening 4a, in photoresist shape 3, is between about 300 to 1300 Angstroms, allowing the definition of deep sub-micron grooves, with identical widths, to be subsequently achieved. This is schematically shown in FIG. 1.

Figure 2:
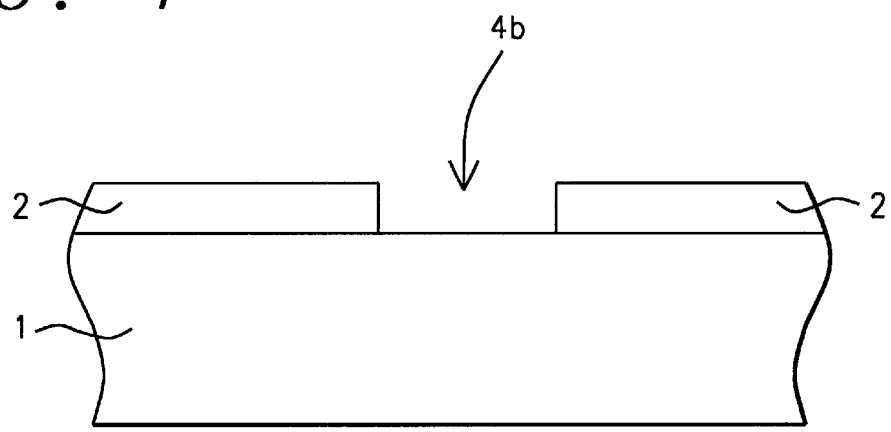

An anisotropic RIE procedure, using $CF_4/CHF_3/Ar$ as an etchant, and using photoresist shape 3, as an etch mask, is next employed to create opening 4b, in insulator layer 2. This is shown schematically in FIG. 2. Opening 4b, exhibits the identical width, of opening 4a, between about 300 to 1300 Angstroms. Photoresist shape 3, is then removed via plasma oxygen ashing and careful wet cleans.

Figure 3:
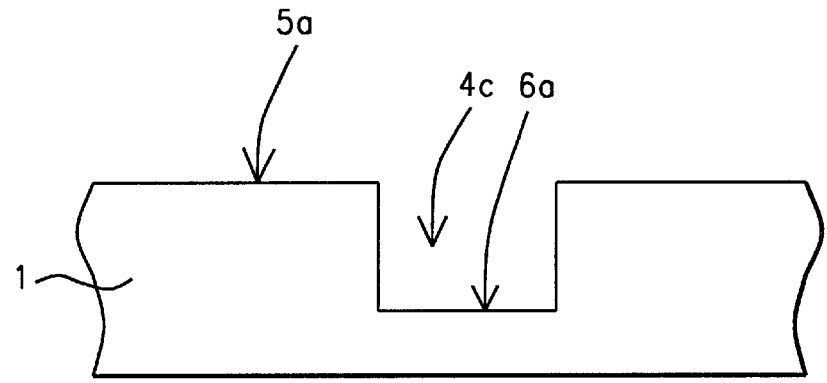
Figure 4:
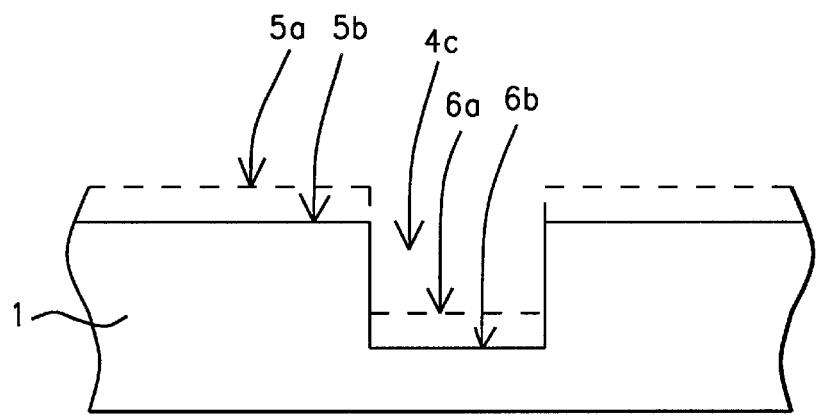

A critical RIE procedure, using an etchant chosen from a group that includes, $Cl_2/HBr/He$—$O_2$, $SF_6/O_2$, or $CF_4/O_2$, depending on the desired selectivity, is next used to define the grooves in semiconductor substrate 1. Any of the above etchants chosen exhibits an etch rate ratio, or etch selectivity between silicon, (semiconductor substrate 1), to insulator layer 2, between about 40 to 1, to 1. Therefore when the entire thickness of insulator layer 2, again between about 20 to 1500 Angstroms, is consumed, between about 300 to 1300 Angstroms of exposed regions of semiconductor substrate 1, will also be consumed, resulting in the formation of groove 4c. Groove 4c, shown schematically shown in FIG. 3, is formed to a depth between about 800 to 1500 Angstroms, in semiconductor substrate 1, with this depth defined at the point of total consumption of the insulator mask, comprised of insulator layer 2. The combination of etch selectivity between insulator layer 2, and semiconductor substrate 1, and the thickness of insulator layer 2, determined the depth of groove 4c. The appearance of silicon surface 5a, after consumption of insulator layer 2, and silicon surface 6a, located at the bottom of groove 4c, fix the final depth of groove 4c, at between about 800 to 1500 Angstroms. If an additional overetch cycle is needed, the removal rate of silicon, from surface 5a, and from surface 6a, will be identical, resulting in no change in the final depth of groove 4c. This is schematically illustrated in FIG. 4, where an overetch cycle, results in groove 4c, now defined by top surface 5b, and by bottom surface 6b, however with the same depth as was previously observed in FIG. 3, resulting from top surface 5a, and bottom surface 6a.

Figure 5:
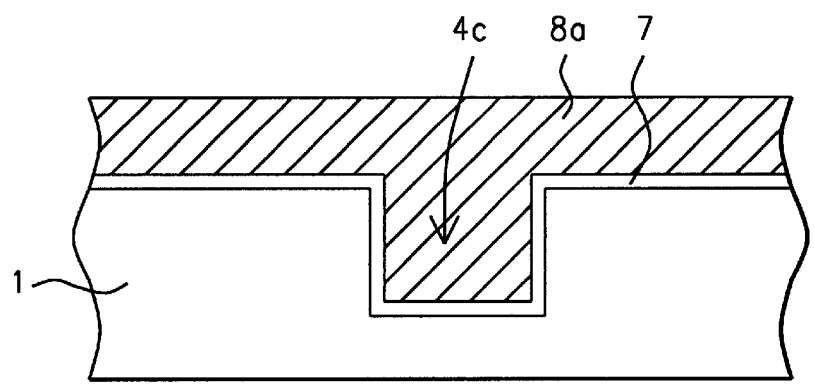
Figure 6:
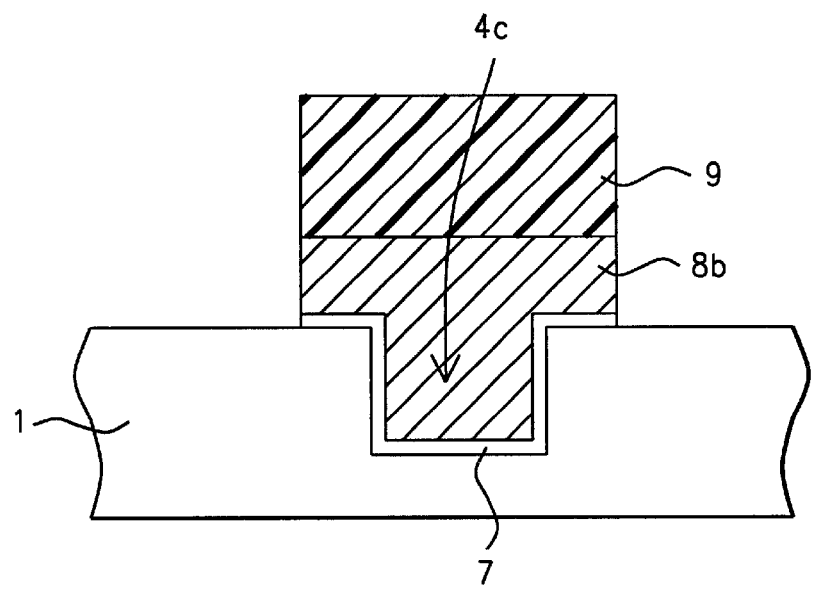

The formation of the grooved gate MOSFET device is next addressed. A gate insulator layer 7, comprised of silicon dioxide, is next thermally grown on exposed silicon surfaces, in an oxygen-steam ambient, at a temperature between about 700 to 900° C., to a thickness between about 20 to 50 Angstroms. A polysilicon layer 8a, is then deposited via LPCVD procedures, to a thickness between about 500 to 3000 Angstroms, completely filling groove 4c. This is schematically shown in FIG. 5. Polysilicon layer 8a, can be doped in situ, during deposition, via the addition of arsine, or phosphine, to a silane ambient, or polysilicon layer 8a, can be deposited intrinsically, then doped via ion implantation of arsenic, or phosphorous ions. Photoresist shape 9, is then used as an etch mask to allow an anisotropic RIE procedure to define polysilicon gate structure 8b, located in groove 4c, with a portion of polysilicon gate structure 8b, and gate insulator 7, located overlying a portion of the top surface of semiconductor substrate 1. The etchant used to selectively define polysilicon gate structure 8b, shown schematically in FIG. 6, is $Cl_2/HBr/He$—$O_2$. Photoresist shape 9, is then removed via plasma oxygen ashing and careful wet cleans, which remove regions of gate insulator 7, not covered by polysilicon gate structure 8b. If lower gate resistance is desired, polysilicon gate structure 8b, can be replaced by a polycide, (metal silicide—polysilicon), gate structure, or by a metal silicide, or metal, gate structure.

Figure 7A:
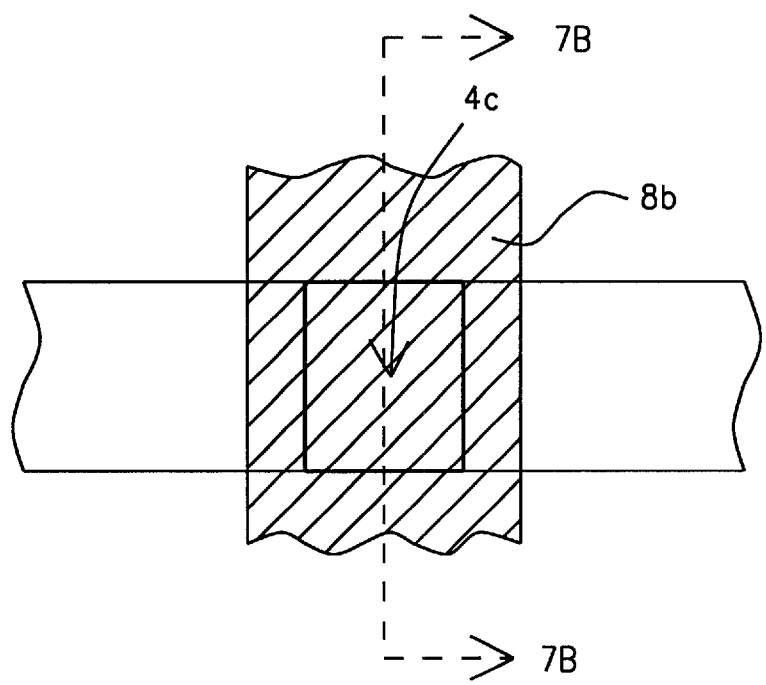
FIG. 7A, which schematically shows a top view of the grooved gate MOSFET device, described in this invention.
Figure 7B:
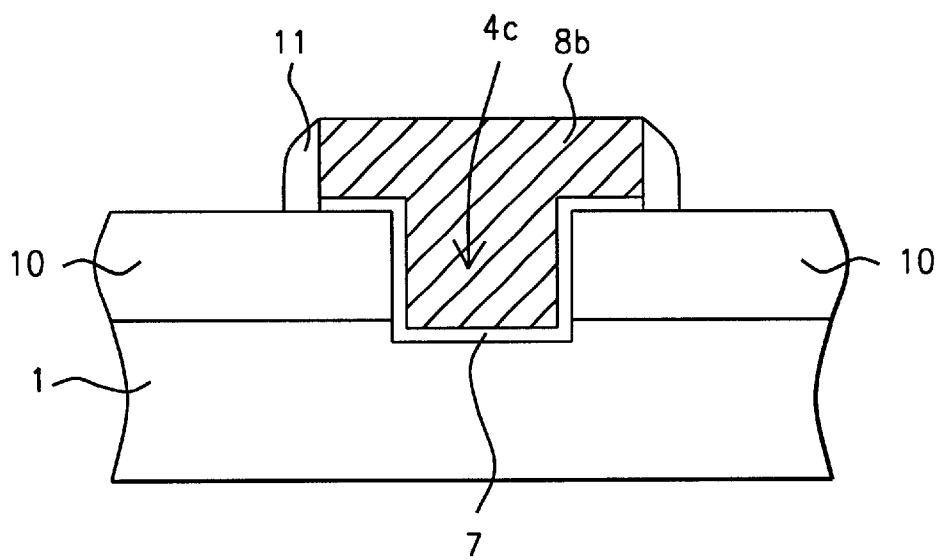

The completion of the grooved gate MOSFET device, is next addressed and schematically shown in FIG. 7A, for a top view, and for a cross-sectional view in FIG. 7B. A source/drain region 10, is selectively formed in regions of semiconductor substrate 1, not covered by polysilicon gate structure 8b, via ion implantation of arsenic or phosphorous ions, at an energy between about 2 to 10 KeV, at a dose between about 1E13 to 1E16 atoms/cm$^2$. This procedure is used to form an N channel, MOSFET device, however if a P channel, MOSFET device is desired, a P type ion implantation procedures would be used to create P type, source/drain regions, in a N well region, previously formed in semiconductor substrate 1, accommodating the defined grooves. Sidewall spacers 11, comprised of silicon oxide, silicon nitride, or silicon oxynitride, are next formed on the exposed sides of polysilicon gate structure 8b, via deposition of the silicon oxide, silicon nitride, or silicon oxynitride layer, via LPCVD or PECVD procedures, at a thickness between about 1000 to 4000 Angstroms, followed by a selective, anisotropic RIE procedure, using $CF_4/CHF_3/Ar$ as an etchant. If desired a heavily doped source/drain region, (not shown in the drawings), can be formed in a region of semiconductor substrate 1, not covered by polysilicon gate structure 8b, or by sidewall spacers 11. A rapid thermal anneal procedure, used to activate the ions of source/drain region 10, result in the movement of these ions, now butting the edge of groove 4c. The ability to form the source/drain region to a depth above the bottom of polysilicon gate structure 8b, residing in groove 4c, will reduce short channel effects encountered with deep sub-micron MOSFET devices, formed using conventional, non-grooved, procedures.

While this invention has been particularly shown and described with reference to, the preferred embodiments thereof, it will be understood by those skilled in the art that various changes in form and details may be made without departing from the spirit and scope of this invention.

What is claimed is:

1. A method of forming a groove in a semiconductor substrate, comprising the steps of:

forming an insulator mask on said semiconductor substrate, with an opening in said insulator mask, exposing a portion of said semiconductor substrate; and performing a selective, anisotropic dry etching procedure to form said groove, in said semiconductor substrate, via removal of a region of said semiconductor substrate, exposed in said opening in said insulator mask, with the desired depth of said groove determined when said insulator mask is totally removed from the surface of said semiconductor substrate, during said selective, anisotropic dry etching procedure, and with said selective, anisotropic dry etching procedure being a RIE procedure, using an etchant chosen from a group that includes $Cl_2/HBr/He$—$O_2$, with an etch ratio of silicon to silicon oxide, between about 40 to 1, to 1.

2. The method of claim 1, wherein said insulator mask is comprised of a silicon oxide layer, obtained via LPCVD or PECVD, or thermal oxidation procedures, at a thickness between about 20 to 1500 Angstroms.

3. The method of claim 1, wherein said insulator mask is comprised of either silicon nitride, or silicon oxynitride, obtained via LPCVD or PECVD procedures, at a thickness between about 20 to 1500 Angstroms.

4. The method of claim 1, wherein said opening, in said insulator mask, is between about 300 to 1300 Angstroms, in width.

5. The method of claim 1, wherein said groove, in said semiconductor substrate, is between about 800 to 1500 Angstroms, in depth.

6. The method of claim 1, wherein the width, of said groove is between about 300 to 1300 Angstroms.

7. A method of fabricating a grooved gate, metal oxide semiconductor field effect transistor, (MOSFET), device, on a semiconductor substrate, comprising the steps of:

depositing an insulator layer on said semiconductor substrate;

patterning of said insulator layer to form an insulator mask, with an opening in said insulator mask, exposing a portion of said semiconductor substrate;

performing a selective, anisotropic RIE procedure, creating a groove in the region of said semiconductor exposed in said opening, in said insulator mask, with the depth of said groove finalized when complete removal of said insulator mask is accomplished, during said selective, anisotropic RIE procedure, wherein said selective, anisotropic RIE procedure, used to form said groove, is performed using an etchant chosen from a group that includes $Cl_2/HBr/He$—$O_2$, $SF_6/O_2$, or $CF_4/O_2$, with an etch rate ratio of silicon to silicon oxide, between about 40 to 1, to 1, and wherein said groove is formed to a depth between about 800 to 1500 Angstroms, and with a width between about 300 to 1300 Angstroms;

growing a silicon oxide, gate insulator layer, depositing a polysilicon layer;

patterning of said polysilicon layer to form a grooved gate, polysilicon structure, with a first portion of said grooved gate, polysilicon structure, located in said groove, and with a second portion of said grooved gate, polysilicon structure, overlying a portion of the top surface of said semiconductor substrate, in a region adjacent to said groove;

forming a source/drain region in an area of said semiconductor substrate, not occupied by said grooved gate, polysilicon gate structure;

forming insulator spacers on the sides of said second portion of said grooved gate, polysilicon structure; and forming a heavily doped, source/drain region in an area of said semiconductor substrate, not covered by said grooved gate, polysilicon structure, or by said insulator spacers.

8. The method of claim 7, wherein said insulator layer is a silicon oxide layer, obtained via LPCVD or PECVD, or thermal oxidation procedures, at a thickness between about 20 to 1500 Angstroms.

9. The method of claim 7, wherein said insulator layer is either a silicon nitride, or a silicon oxynitride layer, obtained via LPCVD or PECVD procedures, at a thickness between about 20 to 1500 Angstroms.

10. The method of claim 7, wherein said insulator mask is formed via an anisotropic RIE procedure, using $CF_4/CHF_3/SAr$ as an etchant, with said opening, in said insulator mask having a width between about 300 to 1300 Angstroms.

11. The method of claim 7, wherein said silicon dioxide, gate insulator layer, is thermally grown in an oxygen—steam ambient, at a temperature between about 700 to 900° C., to a thickness between about 20 to 50 Angstroms.

12. The method of claim 7, wherein said polysilicon layer is obtained via LPCVD procedures, at a thickness between about 500 to 3000 Angstroms, and either doped in situ, during deposition, via the addition of arsine or phosphine, to a silane ambient, or doped via an arsenic, or phosphorous, ion implantation procedure, applied to an intrinsically deposited, said polysilicon layer.

13. The method of claim 7, wherein said grooved gate, polysilicon structure, is obtained via an anisotropic RIE procedure, applied to said polysilicon layer, using $Cl_2/HBr/He$—$O_2$, as an etchant.

* * * * *